(12) United States Patent
Kripesh et al.

(10) Patent No.: US 7,230,318 B2
(45) Date of Patent: Jun. 12, 2007

(54) RF AND MMIC STACKABLE MICRO-MODULES

(75) Inventors: Vaidyanathan Kripesh, Singapore (SG); Mihai Dragos Rotaru, Singapore (SG); Ganesh Vetrivel Periasamy, Singapore (SG); Seung Uk Yoon, Singapore (SG); Ranganathan Nagarajan, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 207 days.

(21) Appl. No.: 10/746,199

(22) Filed: Dec. 24, 2003

(65) Prior Publication Data

US 2005/0146049 A1    Jul. 7, 2005

(51) Int. Cl.
*H01L 21/768* (2006.01)
*H01L 29/40* (2006.01)
*H01L 23/52* (2006.01)
*H01L 21/4763* (2006.01)
*H01L 21/44* (2006.01)

(52) U.S. Cl. ............... 257/621; 257/774; 257/E21.597; 438/629; 438/667; 438/672

(58) Field of Classification Search ................ 257/621, 257/774, E21.597, 691; 438/629, 667, 672
See application file for complete search history.

(56) References Cited

U.S. PATENT DOCUMENTS 5,587,119 A    12/1996    White ..................... 264/104
5,656,553 A    8/1997    Leas et al. ................ 438/15
5,682,062 A    10/1997    Gaul ........................ 257/686
6,268,660 B1    7/2001    Dhong et al. ............ 257/774
6,441,479 B1 *    8/2002    Ahn et al. ................ 257/700
7,005,324 B2 *    2/2006    Imai .......................... 438/113

FOREIGN PATENT DOCUMENTS

WO    WO 98/39781    9/1998
WO    WO 02/063686 A2    8/2002

\* cited by examiner

*Primary Examiner*—Luan Thai
(74) *Attorney, Agent, or Firm*—Saile Ackerman LLC; Stephen B. Ackerman; Rosemary L. S. Pike

(57) ABSTRACT

A new method to form shielded vias with microstrip ground plane in the manufacture of an integrated circuit device is achieved. The method comprises, first, providing a substrate. The substrate is etched through to form holes for planned shielded vias with microstrip ground plane. A first dielectric layer is formed overlying the top side of the substrate and lining the holes. A first conductive layer is deposited overlying the first dielectric layer and lining the holes. A second dielectric layer is deposited overlying the first conductive layer and lining the holes. A second conductive layer is deposited overlying the second dielectric layer and filling the holes. The second conductive layer is planarized to confine the second conductive layer to the holes and to thereby complete the shielded vias with microstrip ground plane. Silicon carrier modules and stacked, multiple integrated circuit modules are formed using shielded vias with microstrip ground plane to improve RF performance.

13 Claims, 6 Drawing Sheets though wafer interconnects have been successfully demonstrated in the art. A stacked silicon system is one where multiple integrated circuit devices are vertically stacked, one upon another. Stacking circuit modules creates area efficiencies in the same way that a high rise office building is more land efficient than a single story building. A very complex function or group of functions can be integrated onto several ICs while taking a relatively small surface area of the system circuit board. Wafer through connects are a technique whereby holes are formed completely through the semiconductor substrate. Circuit signals from the top side of the integrated circuit can then be routed through the bulk of the substrate to the bottom side. This through interconnect, or through via, capability creates many packaging options to route signals in the vertical direction and, again, reduce the required surface area of the device or system.

RF AND MMIC STACKABLE MICRO-MODULES

BACKGROUND OF THE INVENTION (1) Field of the Invention

The invention relates to a method to form an integrated circuit device, and, more particularly, to a method to form an interconnecting structure for use in integrating multiple, RF and MMIC stackable modules.

(2) Description of the Prior Art

In the art of integrated circuits, electrical interconnection and packaging are key enabling technologies. Much recent work has been done to integrate multiple devices in three dimensions. That is, many universities and research institutes are now working on technologies to reduce the volume of and to improve the performance of integrated systems of multiple ICs. In this regard, silicon stacking and through wafer interconnects have been successfully demonstrated in the art. A stacked silicon system is one where multiple integrated circuit devices are vertically stacked, one upon another. Stacking circuit modules creates area efficiencies in the same way that a high rise office building is more land efficient than a single story building. A very complex function or group of functions can be integrated onto several ICs while taking a relatively small surface area of the system circuit board. Wafer through connects are a technique whereby holes are formed completely through the semiconductor substrate. Circuit signals from the top side of the integrated circuit can then be routed through the bulk of the substrate to the bottom side. This through interconnect, or through via, capability creates many packaging options to route signals in the vertical direction and, again, reduce the required surface area of the device or system.

A major limitation of the above-described approaches to three-dimensional integration is the high frequency performance of the resulting, vertically integrated system. The substrate bulk material is typically silicon having a relatively low resistance. The resistivity of the silicon substrate is well suited to the formation of surface level CMOS and bipolar devices. However, when high frequency signals are carried vertically through the bulk substrate, the low resistivity proves to be lossy and results in significant signal attenuation. For example, a conventional silicon substrate with a resistance of between about 5 Ohms and about 6 Ohms will cause a transmitted signal loss of about 0.5 dB for a 1 GHz signal that is passed from the top side of the substrate to the bottom side of the substrate using a through via. The high frequency or RF performance can be improved somewhat by increasing the resistance of the silicon or by replacing the silicon substrate with an insulator such as silicon dioxide. However, the RF performance is still not suitable for very high frequency devices or for multiple module, vertically stacked devices. The vertically passed signal simply interacts with the substrate too much and results in signal attenuation. In addition, the prior art techniques used for passing signals through the substrate exhibit poor impedance matching and therefore result in lossy RF performance.

Several prior art inventions relate to integrated circuit modules and packaging schemes and to through vias. U.S. Pat. No. 6,268,660 B1 to Dhong et al describes a method for multiple integrated circuit, module packaging. A silicon substrate has a plurality of through vias formed therein by drilling or by ultrasonic milling. Copper vias are then formed by plating and polishing. U.S. Pat. No. 5,656,553 to Leas et al discloses a method to form a multiple chip module by stacking die. Interconnection between die is made be forming a metal interconnect layer on a side surface of the stack. U.S. Pat. No. 5,587,119 to White shows a method to form a coaxial via in a substrate. An aperture is drilled through the substrate. A first conductor layer is formed to line the aperture and lies next to the substrate. The aperture is then filled by a dielectric layer. A smaller aperture is then drilled through the dielectric layer. The second aperture is then filled with a second conductor layer. International Patent Application WO 02/063686 A2 to Forbes et al teaches a method to form an integrated circuit with through holes having coaxial, inner and outer metal layers. U.S. Pat. No. 5,682,062 to Gaul demonstrates a method to form stacked, integrated circuit devices. International Patent Application WO 98/39781 to Gallagher et al teaches a method to form a multiple layer, printed circuit board. The prior art approaches have a major limitation. These approaches cannot provide controllable dielectric thicknesses within design requirements. However, the present invention provides controllable dielectric thicknesses between about 50 Å and about 500,000 Å depending on the design requirements.

SUMMARY OF THE INVENTION

A principal object of the present invention is to provide an effective and very manufacturable method to form vertical, integrated circuit interconnects.

A further object of the present invention is to provide a method to form vertical, integrated circuit interconnects having effective shielded vias with microstrip ground plane.

A yet further object of the present invention is to provide a method to form shielded vias with microstrip ground plane with exhibit excellent RF performance.

A yet further object of the present invention is to provide a method to form stackable, silicon carrier modules having excellent RF performance.

A yet further object of the present invention is to provide a method to form stacked, multiple IC modules having excellent RF performance.

Another further object of the present invention is to provide improved, shielded vias with microstrip_ground plane in a silicon substrate.

Another further object of the present invention is to provide a stackable, silicon carrier module having excellent RF performance.

Another further object of the present invention is to provide a stacked, multiple IC module having excellent RF performance.

In accordance with the objects of this invention, a method to form shielded vias with microstrip ground plane in the manufacture of an integrated circuit device is achieved. The method comprises, first, providing a substrate. The substrate is etched through to form holes for planned shielded vias with microstrip ground plane. A first dielectric layer is formed overlying the substrate and lining the holes. A first conductive layer is deposited overlying the first dielectric layer and lining the holes. A second dielectric layer is deposited overlying the first conductive layer and lining the holes. A second conductive layer is deposited overlying the second dielectric layer and filling the holes to thereby complete the shielded vias with microstrip ground plane.

Also in accordance with the objects of this invention, a method to form a silicon carrier module is achieved. The method comprises, first, providing a silicon substrate. The silicon substrate is etched through to form holes for planned shielded vias with microstrip ground plane. A first dielectric layer is formed overlying the silicon substrate and lining the holes. A first conductive layer is deposited overlying the first dielectric layer and lining the holes. A second dielectric layer is deposited overlying the first conductive layer and lining the holes. A second conductive layer is deposited overlying the second dielectric layer and filling the holes to thereby complete the shielded vias with microstrip ground plane. First metal lines are formed overlying the top side of the substrate and contacting the shielded vias with microstrip ground plane. Second metal lines are formed overlying the bottom side of the substrate and contacting to the shielded vias with microstrip ground plane. Top side solder bumps are formed on the first metal lines. Bottom side solder bumps are formed on the second metal lines.

Also in accordance with the objects of this invention, a method to form a multiple circuit module is achieved. The method comprises, first, forming a plurality of silicon carrier modules. The modules each comprise, first, a silicon substrate. A first dielectric layer overlies the silicon substrate. A first conductive layer overlies the first dielectric layer. A second dielectric layer overlies the first conductive layer. A plurality of shielded vias with microstrip ground plane in the silicon substrate each comprise a through hole filled by a concentric plug comprising the first dielectric layer surrounding the first conductive layer surrounding the second dielectric layer surrounding a second conductive layer. A plurality of first metal lines contact the shielded vias with microstrip ground plane on the top side of the silicon substrate. A plurality of second metal lines contact the coaxial vias on the bottom side of the silicon substrate. A plurality of top side solder bumps lie on the first metal lines of the silicon substrate. A plurality of bottom side solder bumps lie on the second metal lines of the silicon substrate. A plurality of integrated circuit die are attached to the plurality of silicon carrier modules by bonding the integrated circuit die to the top side solder bumps. The plurality of silicon carrier modules are vertically stacked by bonding the bottom side solder bumps of overlying silicon carrier modules to the first metal lines of underlying silicon carrier modules.

Also in accordance with the objects of this invention, a carrier module device is achieved. The device comprises, first, a substrate. A first dielectric layer overlies the substrate. A first conductive layer overlies the first dielectric layer. A second dielectric layer overlies the first conductive layer. A plurality of shielded vias with microstrip ground plane in the silicon substrate each comprise a through hole filled by a concentric plug comprising the first dielectric layer surrounding the first conductive layer surrounding the second dielectric layer surrounding a second conductive layer. A plurality of first metal lines contact the shielded vias with microstrip ground plane on the top side of the silicon substrate. A plurality of second metal lines contact the shielded vias with microstrip ground plane on the bottom side of the silicon substrate. A plurality of top side solder bumps lie on the first metal lines of the silicon substrate. A plurality of bottom side solder bumps lie on the second metal lines of the silicon substrate.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose methods to form interconnection structures in the manufacture of integrated circuit devices. A method to form shielded vias with microstrip ground plane for passing signals between top and bottom sides of substrates is disclosed. A method to form a silicon carrier module for stacking integrated circuit devices is disclosed. A method to form stacked, multiple integrated circuit modules is disclosed. Interconnection and module devices are disclosed. It should be clear to those experienced in the art that the present invention can be applied and extended without deviating from the scope of the present invention.

Referring now to FIGS. 1 through 9, the first preferred embodiment of the present invention is illustrated. Several important features of the present invention are shown and discussed below. The present invention provides a method to fabricate wafer-level interconnects exhibiting greatly improved RF performance. These interconnects are further applied to the formation of silicon carrier modules to which RF circuits are mounted. Several such silicon carrier modules can be stacked to form a complex, multiple chip system having excellent RF performance and reliability.

Figure 1:
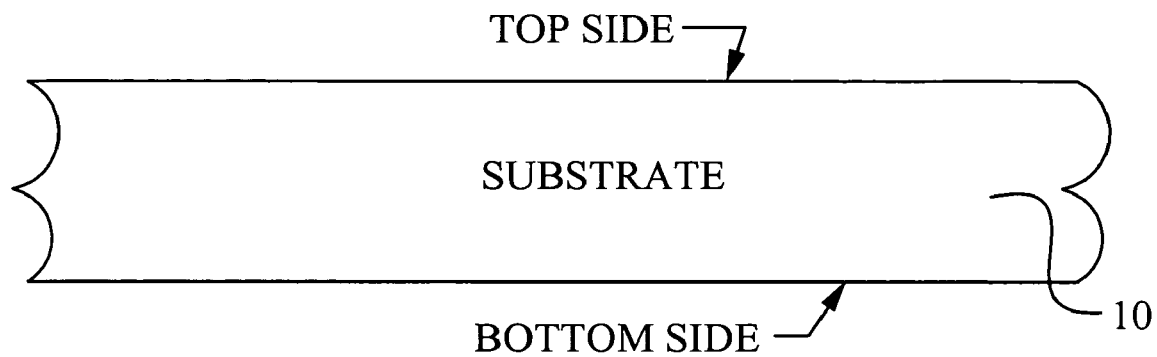
FIGS. 1 through 9 illustrate a first preferred embodiment of the present invention showing a preferred method of formation of a silicon carrier module.

Referring particularly to FIG. 1, a partially completed silicon carrier module is shown in cross section. As a first step, a substrate 10 is provided. The substrate 10 may comprise any of several materials including semiconductors, dielectrics, or combined semiconductor/dielectrics such as silicon on insulator (SOI). More preferably, the substrate 10 comprises silicon. An important advantage of the present invention is that high frequency or RF capable vias may be formed even if the substrate has a low resistivity. The substrate 10 is preferably ground down to a thickness of between about 50 microns and about 300 microns. This is substantially thinner than a typical silicon wafer that is used for forming integrated circuit devices and makes etching holes through substrate 10 substantially easier. The substrate 10 is shown with a top side and bottom side. The top and bottom sides may, in practice, be identical in construction. However, the upper surface of the substrate 10 in FIGS. 1 through 10 is referred to as the top side while the lower surface is referred to as the bottom side.

Figure 2:
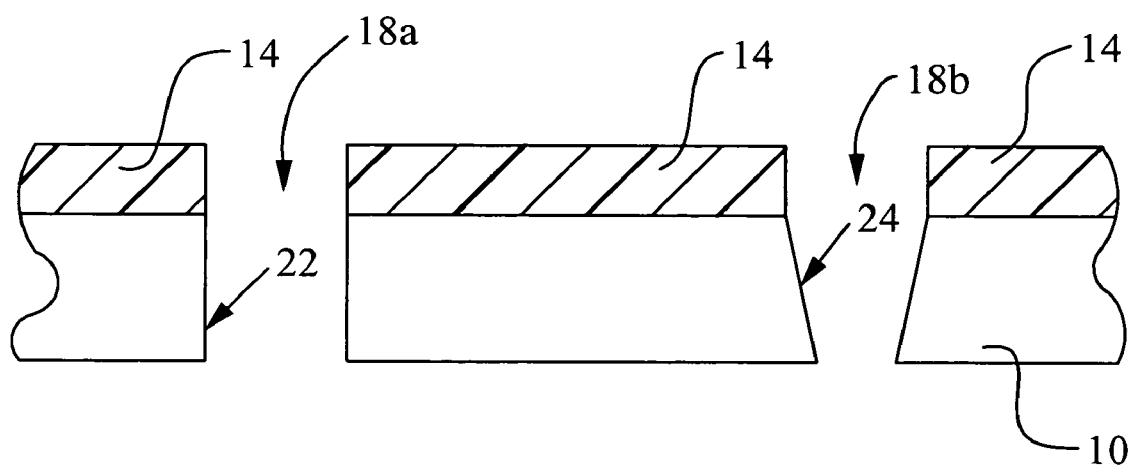

Referring now to FIG. 2, a first important feature of the present invention is shown. The substrate 10 is etched through to form holes 18*a* and 18*b* for planned shielded vias with microstrip ground plane. Preferably, a masking layer 14 is first formed overlying the top side surface of the substrate 10. For example, a photoresist layer 14 may be deposited overlying the substrate 10. The photoresist layer 14 may then be exposed to actinic light through a mask such that part of the photoresist layer 14 is cross linked while another part of the photoresist layer 14 is not cross linked. The photoresist layer 14 is then developed. As a result, the pattern of the mask is transferred, as a positive or a negative image, to the masking layer 14. Alternatively, the masking layer 14 may comprise a material, such as silicon nitride, that is patterned using a photolithographic process. The holes 18*a* and 18*b* are preferably etched using either a dry process or a wet process. Dry processing, such as reactive ion etching, laser drilling, or microblasting vertical walls, is capable of near anisotropic etching. As shown for the left side hole 18*a*, the dry etching process can create a perpendicular cross section. Wet etching, such as PAECE, is typically more constrained to following specific etching directions as shown by the sloped sidewalls of the right side hole 18*b*. In the remaining cross sections of the preferred embodiment, the vertical profile hole is shown and is labeled as 18 for simplicity. Note that the holes 18a and 18b are etched completely through the substrate 10.

Figure 3:
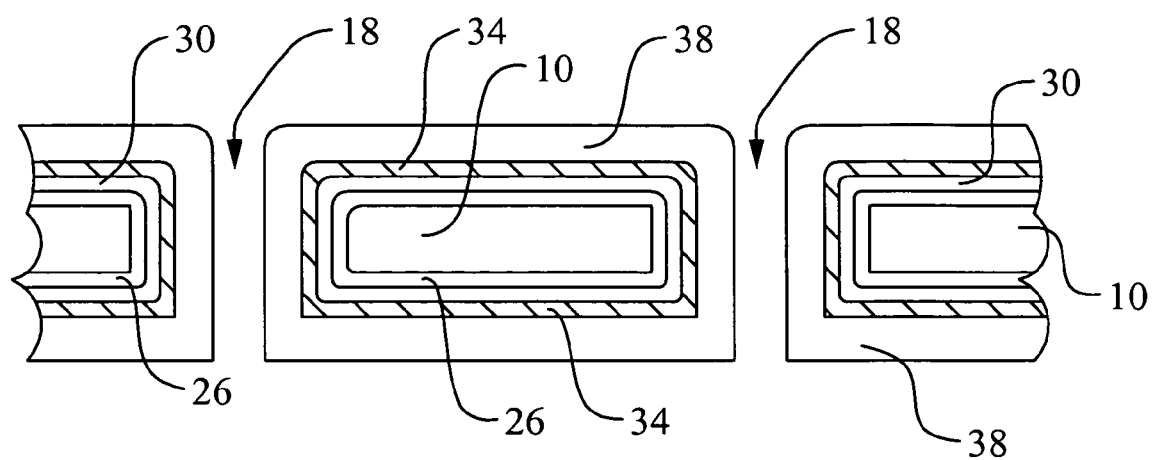

Referring now to FIG. 3, other important features of the present invention are shown. A first dielectric layer 26 is formed overlying the top side and bottom side of the substrate 10 and lining the holes 18. The first dielectric layer 26 preferably comprises silicon oxide and, more preferably, is formed by a chemical vapor deposition (CVD) of silicon oxide. Alternatively, the first dielectric layer 26 may be formed by thermal oxidation of the substrate 10. The first dielectric layer 26 provides an insulating barrier between the substrate 10 and the subsequently formed shielded vias with microstrip ground plane. It is important that the substrate 10 be isolated from the shielded vias with microstrip ground plane so that all of the electric field (E-field) energy is contained in the vias and is prevented from entering the substrate 10. The first dielectric layer 26 is preferably formed to a thickness of between about 100 Å and about 20,000 Å.

As an optional feature, a first barrier layer 30 is next deposited overlying the first dielectric layer 26 and lining the holes 18. The first barrier and adhesion layer 30 is used to form a diffusion barrier between the first dielectric layer 26 and the subsequently formed first conductive layer 34. The is an important feature if the first conductive layer 34 comprises a metal, such as copper, that will diffuse into the first dielectric layer 26 if that layer 26 comprises silicon oxide. The first barrier layer 30 preferably comprises Ta, Ti, TaN, TiN, TiW, or CrCu. If used, the first barrier layer 30 is preferably deposited by a CVD process to a thickness of between about 50 Å and about 5,000 Å.

A first conductive layer 34 is next deposited overlying the first dielectric layer 26, and the first barrier layer 30, if used, and lining the holes 18. The first conductive layer 34 forms the shielding layer of the coaxial vias. The first conductive layer 34 preferably comprises a metal layer, such as copper or aluminum. Alternatively, the first conductive layer 34 may comprise copper, nickel, or gold. The first conductive layer 34 is preferably deposited by a physical vapor deposition (PVD), plating, or a combination process. The first conductive layer 34 is preferably between about 500 Å and about 10,000 Å thick.

As another optional feature, a second barrier layer, not shown, may be deposited overlying the first conductive layer 34 and lining the holes 18. The second barrier layer is used to form a diffusion barrier between the first conductive layer 34 and the subsequently formed second dielectric layer 38. The barrier is an important feature if the first conductive layer 34 comprises a metal, such as copper, that will diffuse into the second dielectric layer 38 if that layer 38 comprises silicon oxide. The second barrier layer, not shown, preferably comprises Ti, TiN, Ta, TaN, TiW, or CrCu. If used, the second barrier layer is preferably deposited by a CVD process to a thickness of between about 50 Å and about 5,000 Å.

A second dielectric layer 38 is next deposited overlying the first conductive layer 34 and the second barrier layer, if used, and lining the holes 18. The second dielectric layer 38 forms the internal insulator of the shielded vias with microstrip ground plane. The second dielectric layer 38 preferably comprises silicon oxide or polyimide. However, the second dielectric layer 38 may also comprise other insulators, such as silicon nitride, silicon oxynitride, or metal oxides. The second dielectric layer 38 is preferably deposited using a CVD process or a plating process to a thickness of between about 50 Å and about 500,000 Å. The thickness of the second dielectric layer 38 is varied in accordance with the via design. This variance in thickness is required to achieve less signal losses.

Figure 4:
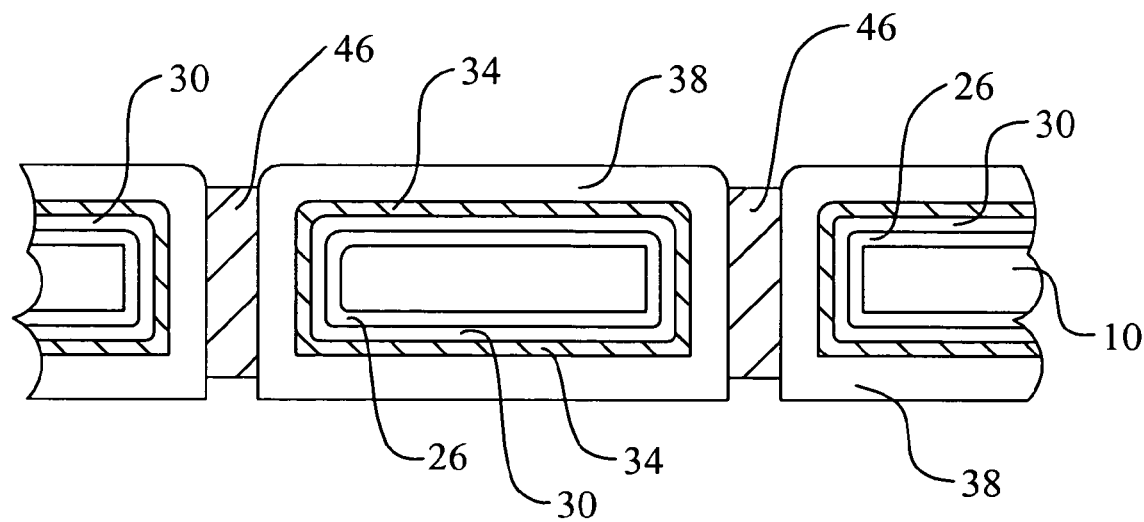

Referring now to FIG. 4, another important feature of the present invention is illustrated. A second conductive layer 46 is deposited overlying the second dielectric layer 38 and filling the holes 18 to thereby complete the shielded vias with microstrip ground plane. The second conductive layer 46 forms the signal conductor for the completed shielded vias with microstrip ground plane. The second conductive layer 46 may comprise a metal layer, such as copper or aluminum. In one preferred embodiment, the second conductive layer 46 comprises copper that is deposited by electroplating. In another preferred embodiment, the second conductive layer 46 comprises a conductive fill material such as conductive silver paste, conductive copper paste, conductive gold paste, conductive nano silver and gold pastes. If a conductive fill material is used for the second conductive layer 46, then any excess material may be removed from the second dielectric layer 38 surface using a planarization operation, such as chemical mechanical polishing or plasma etching or wet etching, to confine the material 46 to the vias.

Figure 5:
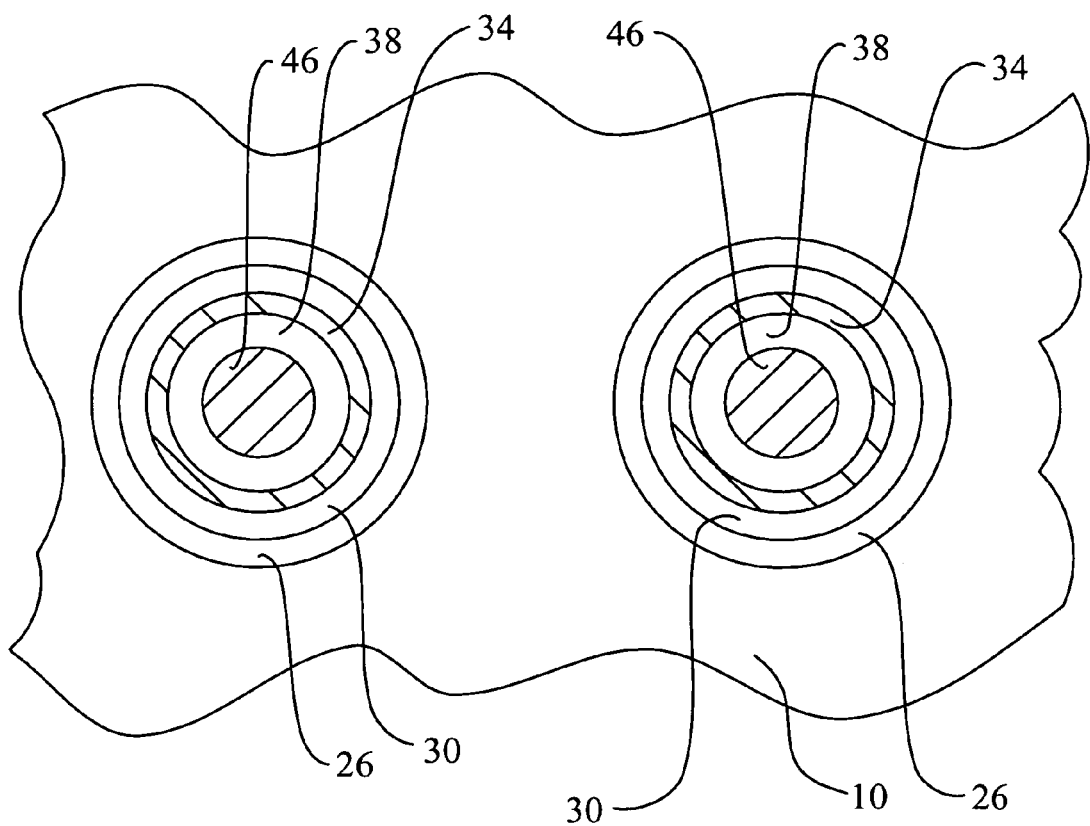

The resulting vias are shown in top view in FIG. 5. Each via can be seen to comprise a through hole filled by a concentric plug comprising the first dielectric layer 26 surrounding the first conductive layer 34 surrounding the second dielectric layer 38 surrounding a second conductive layer 46. The resulting vias are shielded vias with microstrip ground plane. The second conductive layer 46 is the signal carrying material. The second dielectric layer 38 is an inter-conductor insulator. The first conductive layer 34 is the shielding layer. In the preferred embodiment, the first conductive layer 34 is further coupled to ground. In this way, the first conductive layer 34 acts as a ground shield to surround and to confine the E-field of the signal conducted on the second conductive layer 46.

As an important feature, the shielded vias with microstrip ground plane are formed such that the silicon substrate 10 does not lie between the signal conductor 46 and the ground conductor 34. In prior art embodiments of through vias, each vias only comprises a single conductor. Therefore, some vias are dedicated to signals and other vias are dedicated to grounding. In an attempt to provide ground shielding in the prior art, a signal via may be surrounded by grounding vias in a technique called ground-signal-ground (GSG) interconnecting. GSG offers only limited improvement in the high frequency capability through vias, however, because a small area of the silicon substrate 10 always lies between the signal and ground vias. Part of the high frequency E-field energy of the RF signal on the signal via is therefore coupled into the substrate 10 and results in signal loss.

By comparison, the novel, coaxial vias of the present invention insure that the E-field is trapped inside of the via between the first and second conductive layers 34 and 46. This results is less E-field energy loss to the substrate 10 and, further, results in higher frequency/lower loss performance of the through vias. Simulations reveal that the novel, shielded vias with microstrip ground plane method of the present invention exhibits far less RF signal attenuation than comparable SGS systems. For example, the shielded vias with microstrip ground plane demonstrates a loss of about −0.5 dB at about 40 GHz while GSG losses vary from about −1.75 dB at 40 GHz for a 50 μm ground pitch to about −3.7 dB at 40 GHz for a 200 μm ground pitch.

Figure 6:
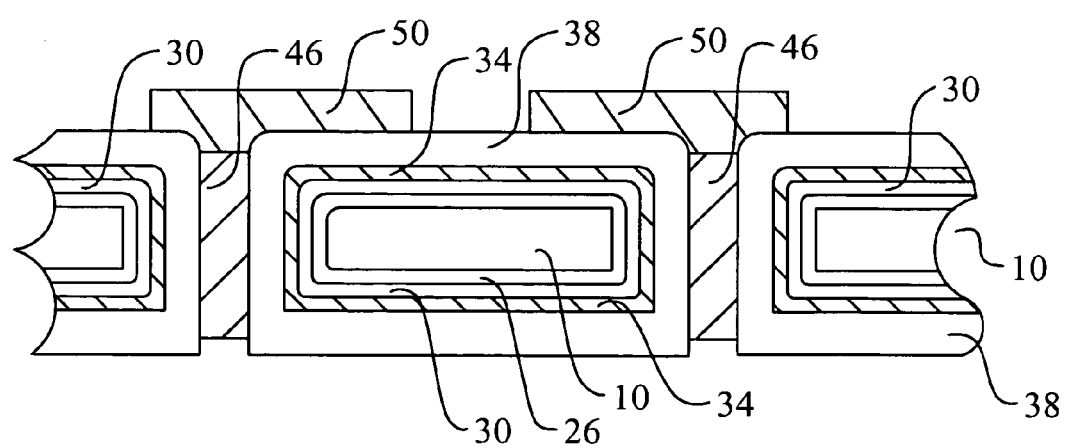

Referring now to FIG. 6, the partially complete device is again shown in cross section. As an important feature in the formation of a silicon carrier module, first metal lines 50 are formed overlying the second dielectric layer 38. The first metal lines 50 comprise, for example, aluminum or copper. The first metal 50 is preferably deposited and patterned using conventional processes that are well known in the art. The first metal lines 50 provide top side access to the signal that is conducted through the vias 46. In addition, it is possible to integrate the deposition of the first metal 50 with the via 46 in a single electroplating process.

Figure 7:
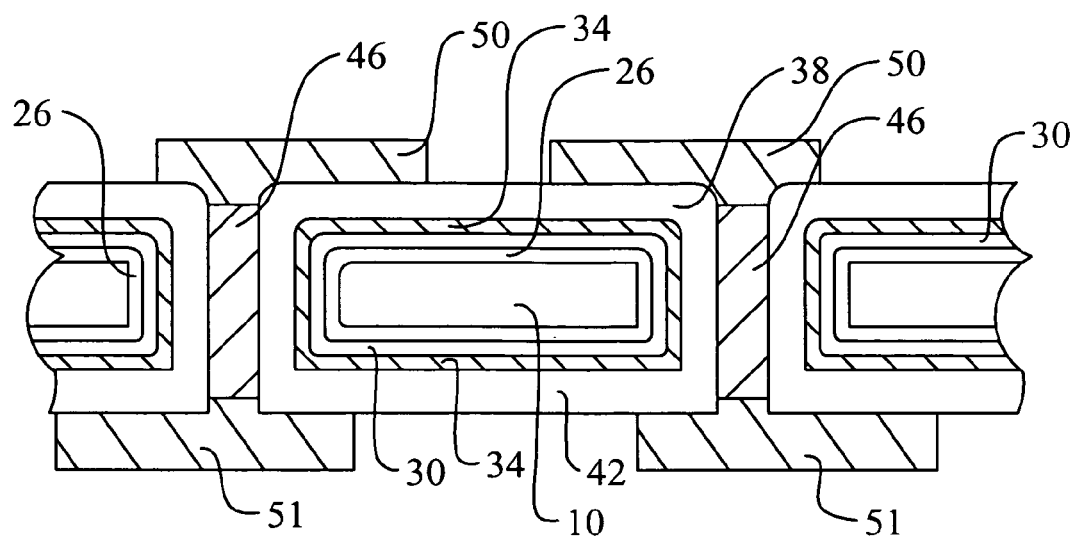

Referring now to FIG. 7, as other important features in a silicon carrier module, the second metal lines 51 may be formed using a conventional process for depositing and patterning metal lines as is known in the art. The second metal lines 51 preferably comprise a metal, such as copper or aluminum, that is deposited using, for example, a PVD process. The second metal 51 is then preferably patterned using a photolithographic process as described above. In addition, it is possible to integrate the deposition of the second metal 51 with the via 46 in a single electroplating process.

Figure 8:
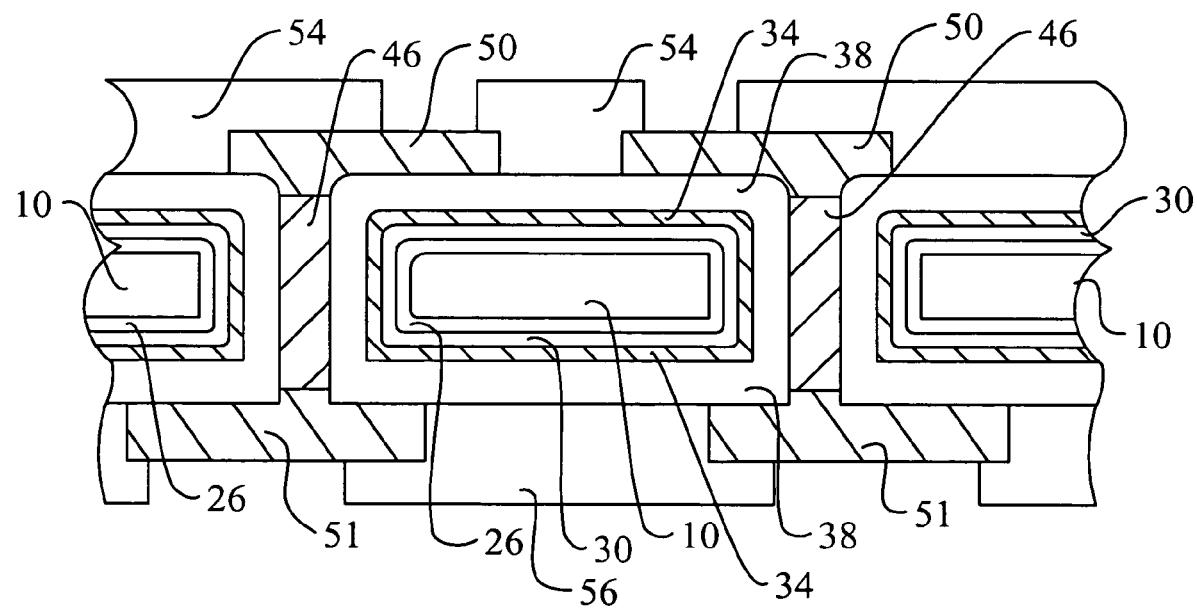

Referring now to FIG. 8, a first passivation layer 54 is formed overlying the first metal lines 50 and the second dielectric layer 38 of the top side of the substrate 10. The first passivation layer 54 is then patterned to expose the underlying first metal lines 50 where contacts to the first metal layer 50 are planned. Similarly, a second passivation layer 56 is formed overlying the second metal lines 51 and the second dielectric layer 38 of the bottom side of the substrate 10. The second passivation layer 56 is then patterned to exposed the underlying second metal lines 51 where contacts to the second metal layer 51 are planned. The first and second passivation layers 54 and 56 preferably comprise plasma enhanced, CVD deposited silicon nitride as is known in the art.

Figure 9:
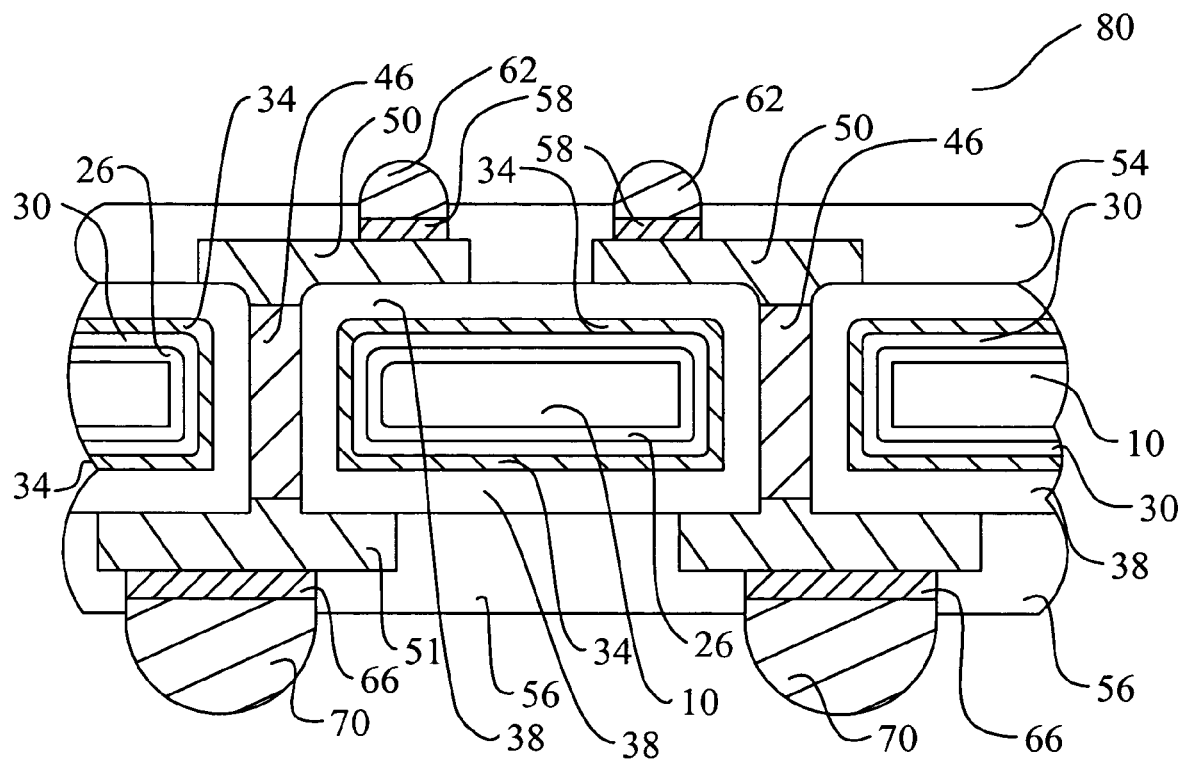

Referring now to FIG. 9, as important additional features, bumps 62 and 70 are formed to provide external access to the finish silicon carrier module 80. The bumps 62 and 70 preferably comprise under bump metallurgical (UBM) layers 58 and 66. These UBM layer 66 may comprise a variety of metals that are specially formed to provide excellent solder bonding, or wetting, and to provide optimal thermal conductive profiles. For example, the UBM layers 58 and 66 comprise TiNiCuAu, TiNiAu, NiAu, electroplated Cu, TiWCu, or CrCuNi. Alternatively, the UBM layer 58 may be combined with the first metal layer 50 or the UBM layer 66 may be combined with the second metal layer 51 to reduce processing steps.

After the UBM layers 58 and 66 are formed, then solder bumps 62 and 70 are formed. The solder bumps 62 and 70 preferably comprise a solder-based material. However, non-solder-based bump materials could be used. If solder is used, then the bump 62 and 70 may be formed by, first, applying a bump material to the top surface and/or bottom surface of the substrate 10. The bump material is then melted sufficiently to case flowing of the bump material 62 and 70. The solder material bonds, or wets, to the first and second metal lines 50 and 51 much better than to the passivation layer 54. As a result, the solder material 62 and 70 adheres to the UBM layers 58 and 66 and does not adhere to the passivation layer 54. Solder pads or balls 62 and 70 are thereby formed. In general, solder bumps 62 and 70 are formed on both sides for good wetting and interconnection properties. However, it is also possible to only form solder bumps on only a single side of the module since solder bumps may be available for bonding from another module in the stack.

In the completed silicon carrier module 80, note that a continuous signal path is shown from the top solder pad 62 on the left side to the bottom solder pad 70 on the left side. Likewise, a continuous signal path is shown from the top solder pad 62 on the rights side to the bottom solder pad 70 on the right side. Further, in the target application, a RF integrated circuit device may be bonded to silicon carrier module 80. For example, an RF integrated circuit device, not shown, may be bonded to the two solder pads on the top side of the carrier 80. The shielded vias with microstrip ground plane 46 provide signal access to this RF device from the solder pads 70 on the bottom side of the carrier 80. Further, the signal access from the top side to the bottom side of the carrier is capable of high frequency operation with minimal signal loss due to E-field energy leakage into the substrate 10.

Figure 10:
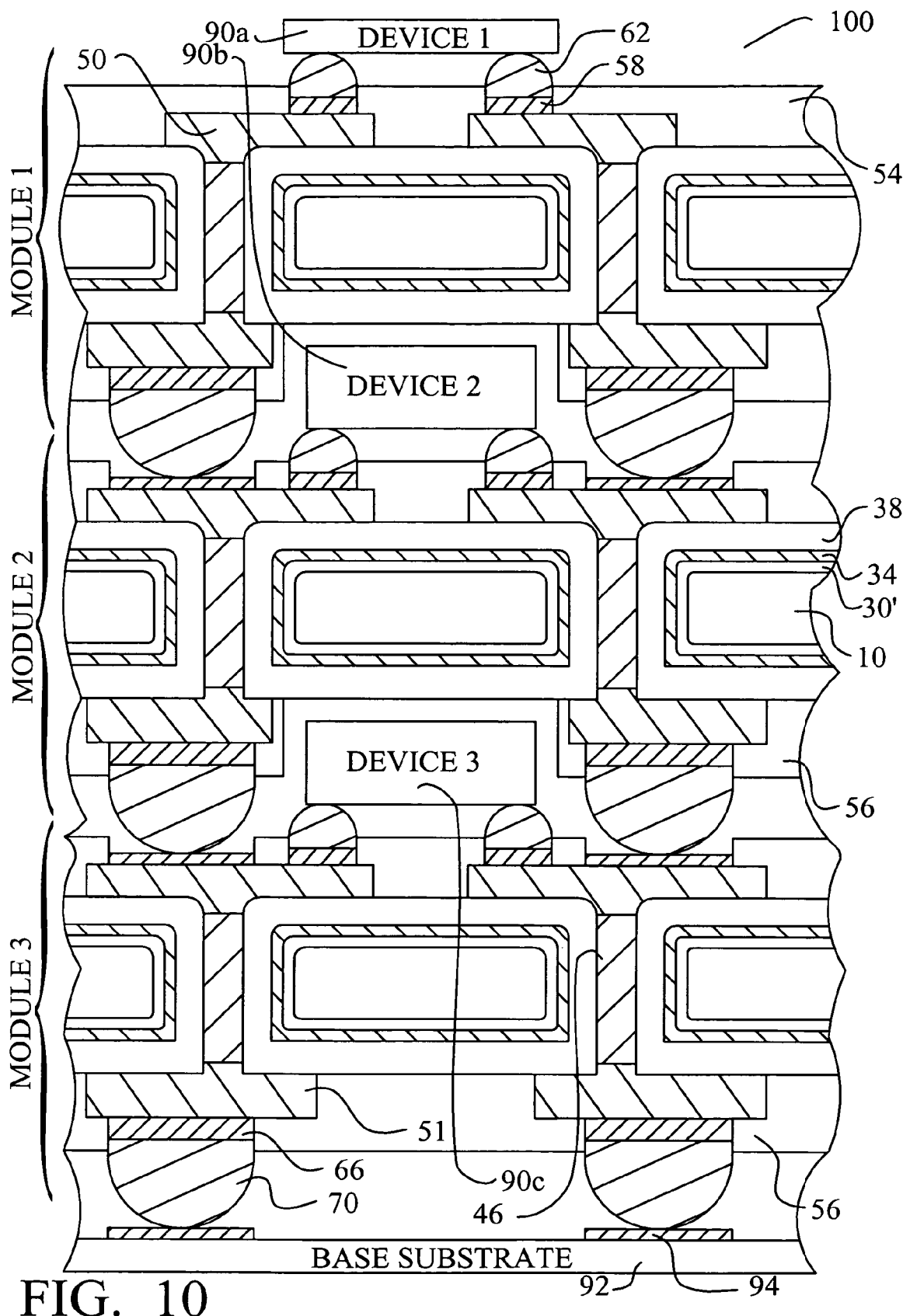
FIG. 10 illustrates a second preferred embodiment of the present invention illustrating the formation of a stacked module device comprising several silicon carrier modules.

Referring now to FIG. 10, a second preferred embodiment of the present invention is illustrated. In this embodiment, a stacked, multiple IC module 100 is illustrated. The multiple module IC (MMIC) shown comprises a plurality of the silicon carrier modules MODULE 1, MODULE 2, and MODULE 3. Each of the modules is constructed essentially as shown in the first embodiment of the present invention. A plurality of integrated circuit devices 90a, 90b, and 90c are stacked together in the MMIC. In this case, DEVICE 1 90a is bonded to the top side solder pads 62 of MODULE 1, DEVICE 2 90b is bonded to the top side solder pads 62 of MODULE 2, and DEVICE 3 90c is bonded to the top side solder pads 62 of MODULE 3. Alternatively, DEVICE 1 and DEVICE 2 may be in a single module.

The modules are then stacked using the solder pads 70 on the bottom sides of each module and pads 58 on the first metal lines 50 of the top sides of each module. In this case, MODULE 1 is bonded to MODULE 2, MODULE 2 is bonded to MODULE 3, and MODULE 3 is bonded to a base substrate 92. By forming a large array of shielded vias with microstrip ground plane 46, top side solder pads 62, and bottom side solder pads 70 on each of the silicon carrier modules, the stackable, multiple chip system 100 provides a large number of high frequency, interconnect paths between the various levels of the stack. The shielded vias with microstrip ground plane interconnects create far lower insertion losses than the prior art through vias. The carrier modules, even where constructed of silicon substrates, can be used for RF and MMIC devices integrated into system package applications with little degradation in performance.

The advantages of the present invention may now be summarized. An effective and very manufacturable method to form vertical, integrated circuit interconnects is achieved. The method provides vertical, integrated circuit interconnects having effective shielded vias with microstrip ground plane. The shielded vias with microstrip ground plane exhibit excellent RF performance. A method to form stackable, silicon carrier modules having excellent RF performance is achieved. The stackable, silicon carrier modules are further used in a method to form stacked, multiple IC modules having excellent RF performance. A stackable, silicon carrier module having excellent RF performance is achieved. A stacked, multiple IC module having excellent RF performance is achieved.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A carrier module device, said device comprising:
   a silicon substrate;
   a first dielectric layer overlying said substrate;
   a first conductive layer overlying said first dielectric layer;
   a second dielectric layer overlying said first conductive layer;
   a plurality of shielded vias with microstrip ground plane in said silicon substrate each comprising a through hole filled by a concentric plug comprising said first dielectric layer surrounding said first conductive layer surrounding said second dielectric layer surrounding a second conductive layer;
   a plurality of first metal lines contacting said shielded vias with microstrip ground plane on the top side of said silicon substrate;
   a plurality of second metal lines contacting said shielded vias with microstrip ground plane on the bottom side of said silicon substrate;
   a plurality of top side solder bumps on said first metal lines of said silicon substrate; and
   a plurality of bottom side solder bumps on said second metal lines of said silicon substrate.

2. The device according to claim 1 further comprising:
   a first passivation layer overlying said first metal lines and having top side pad openings that reveal underlying said first metal lines;
   a first under bump metallurgical layer on said first metal lines exposed by said top side pad openings;
   a second passivation layer overlying said second metal lines and having bottom side pad openings that reveal underlying said second metal lines; and
   a second under bump metallurgical layer on said second metal lines exposed by said bottom side pad openings.

3. The device according to claim 1 further comprising:
   a first barrier layer lying between said first dielectric layer and said first conductive layer; and
   a second barrier layer lying between said first conductive layer and said second dielectric layer.

4. The device according to claim 1 wherein said first dielectric layer comprises silicon oxide.

5. The device according to claim 1 wherein said second dielectric layer comprises silicon oxide.

6. The device according to claim 1 wherein said second conductive layer comprises copper.

7. The device according to claim 1 wherein said conductive layer comprises gold paste, copper paste, silver paste, or silver and gold paste.

8. The device according to claim 1 wherein said substrate comprises silicon.

9. The device according to claim 1 wherein said first conductive layer is coupled to ground.

10. The device according to claim 1 wherein said second dielectric layer is between about 50 Å and about 500,000 Å.

11. A multiple circuit module device, said device comprising:
    a plurality of silicon carrier modules, said modules each comprising:
    a silicon substrate;
    a first dielectric layer overlying said silicon substrate;
    a first conductive layer overlying said first dielectric layer;
    a second dielectric layer overlying said first conductive layer;
    a plurality of shielded vias with microstrip ground plane in said silicon substrate each comprising a through hole filled by a concentric plug comprising said first dielectric layer surrounding said first conductive layer surrounding said second dielectric layer surrounding a second conductive layer;
    a plurality of first metal lines contacting said shielded vias with microstrip ground plane on the top side of said silicon substrate;
    a plurality of second metal lines contacting said shielded vias with microstrip ground plane on the bottom side of said silicon substrate;
    a plurality of top side solder bumps on said first metal lines of said silicon substrate; and
    a plurality of bottom side solder bumps on said second metal lines of said silicon substrate; and
    a plurality of integrated circuit die attached to said plurality of silicon carrier modules by bonding said integrated circuit die to said top side solder bumps wherein said plurality of silicon carrier modules are vertically stacked by bonding said bottom side solder bumps of overlying said silicon carrier modules to said first metal lines of underlying said silicon carrier modules.

12. The device according to claim 11 wherein said a first under bump metallurgical layer is between said first metal layer and said top side solder bumps and wherein a second under bump metallurgical layer is between said second metal layer and said bottom side solder bumps.

13. The device according to claim 11 wherein said first conductive layer is coupled to ground.

* * * * *